United States Patent [19]

Iio et al.

[11] Patent Number: 5,626,908

[45] Date of Patent: May 6, 1997

[54] METHOD FOR PRODUCING SILICON NITRIDE BASED MEMBER COATED WITH FILM OF DIAMOND

[75] Inventors: Satoshi Iio; Masakazu Watanabe, both of Komaki, Japan

[73] Assignee: NGK Spark Plug Co., Ltd., Aichi, Japan

[21] Appl. No.: 453,464

[22] Filed: May 30, 1995

Related U.S. Application Data

[63] Continuation of Ser. No. 10,383, Jan. 28, 1993, abandoned.

[30] Foreign Application Priority Data

Jan. 28, 1992 [JP] Japan ................... 4-013212

[51] Int. Cl.$^6$ ............... C23C 16/26; B05D 3/06
[52] U.S. Cl. ............ 427/249; 427/255; 427/255.1; 427/255.7; 427/575; 427/577
[58] Field of Search .................. 427/249, 255, 427/255.1, 255.7, 575, 577; 51/307; 423/446; 428/408

[56] References Cited

U.S. PATENT DOCUMENTS

| | | | |
|---|---|---|---|
| 5,006,203 | 4/1991 | Purdes | 156/646 |
| 5,028,451 | 7/1991 | Ito et al. | 427/575 |
| 5,200,231 | 4/1993 | Bachmann et al. | 427/249 |
| 5,242,711 | 9/1993 | DeNatale et al. | 427/249 |
| 5,271,971 | 12/1993 | Herb et al. | 427/577 |

FOREIGN PATENT DOCUMENTS

| | | |
|---|---|---|
| 0470644A2 | 2/1992 | European Pat. Off. |
| 60-59086 | 12/1985 | Japan. |
| 63-20911 | 5/1988 | Japan. |
| 63-306805 | 12/1988 | Japan. |
| 3-197677 | 8/1991 | Japan. |
| 3-290383 | 12/1991 | Japan. |
| 2228745 | 9/1990 | United Kingdom. |
| 2240114 | 7/1991 | United Kingdom. |

OTHER PUBLICATIONS

Toshimichi Ito et al., "Diamond Synthesis by the Microwave Plasma CVD Method Using a Mixture of Carbon Monoxide and Hydrogen Gas," *Science and Technology of New Diamond*, pp. 107–109, KTK Scientific Publishers, 1990.

*Primary Examiner*—Roy V. King
*Attorney, Agent, or Firm*—Fish & Richardson P.C.

[57] ABSTRACT

Method for coating a substrate formed of a sintered silicon nitride based material with a film of diamond by a gas phase synthesis technique including a first step of applying a film having a thickness of 0.5 to 2.0 μm at a temperature not higher than a temperature at which grain boundary components of the substrate volatilize, and a second step of synthesizing the film of diamond-and-the-like to a thickness of 5 to 100 μat a temperature which expedites synthesis of the film of diamond.

23 Claims, No Drawings

METHOD FOR PRODUCING SILICON NITRIDE BASED MEMBER COATED WITH FILM OF DIAMOND

This application is a continuation of U.S. application Ser. No. 08/010,383, filed Jan. 28, 1993, now abandoned.

FIELD OF THE INVENTION

This invention relates to a method for producing a silicon nitride based member coated by a film of diamond-and-the-like, which member is employed in a variety of cutting tools, such as tips, end mills, cutters or drills, optical materials or electronic materials, and which exhibits superior wear resistance, corrosion resistance and durability.

Definition

The term "film of diamond-and-the-like" used or synthesized diamond herein represents a film made up of diamond, or a structure analogous to diamond such as carbon with a structure analogous to diamond, or a mixture thereof.

The term "silicon nitride based material" herein represents those materials in which the major phase is silicon nitride or a phase analogous to silicon nitride such as solid solution thereof like Sialon, or a mixture thereof.

BACKGROUND

Related Art

A film of diamond-and-the-like is superior in hardness, wear resistance, electrical insulating properties or thermal conductivity and hence is currently employed in, e.g., cutting tools, optical materials or electronic materials. In order for a member coated with such film of diamond-and-the-like to be used as a cutting tool or the like for a prolonged period of time, it is mandatory that the substrate surface be coated with diamond excellent in tight adhesion characteristics.

For this reason, it has been proposed in, for example, JP Patent KOKOKU Publication No. 60-59086 and JP Patent KOKAI Publication No. 63-306805, to employ a substrate consisting of a sintered body of ceramics, such as silicon nitride, a hard material which has a thermal expansion coefficient approximate to that of diamond and on which the film of diamond-and-the-like can be directly applied easily.

Silicon nitride has a thermal expansion coefficient approximate to that of diamond and is used as a sintered substrate with the least risk of peeling off of a diamond film deposited thereon under thermal stress which occurs subsequent to diamond coating. However, since silicon nitride can be sintered only with difficulty, sintering aids are added thereto. These sintering aids remain as a glassy phase in the grain boundary after sintering of silicon nitride ceramics.

SUMMARY OF THE DISCLOSURE

Discussion of Related Art

The glassy phase in the grain boundary is exposed to a high-temperature plasma atmosphere which is used for synthesizing the diamond-and-the-like film on the substrate and is thereby volatilized. Such volatilization is mainly responsible for peeling off of the film of diamond-and-the-like from the substrate.

In JP Patent Application No. 2-406931 (by the present inventors as part of coinventors, now JP Patent Kokai No. 3-290383 laid open Dec. 20, 1991), one solution has been achieved in producing a member coated with a film of diamond-and-the-like excellent in tight adhesion properties by first subjecting a silicon nitride based sintered body having the above-mentioned glassy phase to a crystallization process followed by coating the resulting sintered body having a crystalline grain boundary phase with the film of diamond-and-the-like.

Problem to be Solved by the Invention

However, in the conventional methods, there were certain substrates which could not be used for a silicon nitride based member coated with the film of diamond-and-the-like in the case where they are used, e.g., as cutting tools because the glassy phase in the grain boundary of the substrate tends to be volatilized even though the substrate is excellent in mechanical properties, such as strength, toughness or hardness. On the other hand, generally the glassy phase is produced at the grain boundary as a result of sintering of the silicon nitride based materials. According to the proposed solution according to said JP Patent Kokai No. 3-290383, the glassy phase thus produced needs to be subjected to a process of crystallization, the number of operating steps and hence production costs are necessarily increased, which have been counted for drawbacks.

It is therefore a primary object of the present invention to provide a novel method which eliminates aforementioned drawbacks.

Concretely, it is therefore an object of the present invention to provide a method for producing a silicon nitride based member which, since silicon nitride ceramics may be freely selected so as to be used as a substrate to be coated with a film of diamond-and-the-like, can be employed for a variety of cutting tools, a variety of protective films, optical materials or electronic materials, and which is excellent in wear resistance, corrosion resistance, and durability.

Means to Solve the Problem silicon nitride as a substrate in the present invention is a difficult-to-sinter material because it is a compound showing a high tendency towards formation of covalent bonds and hence it has a low self-diffusion coefficient of constituent atoms, while being readily decomposed and vaporized at elevated temperatures and exhibiting a high ratio of grain boundary energy to surface energy as compared to ion crystals or metal crystals. For this reason, sintering aid components, such as oxides of magnesium (Mg), aluminum (Al), and oxides of like elements, are added to silicon nitride before sintering for producing silicon nitride ceramics as a substrate material. These sintering aid components are converted into a liquid phase under elevated temperatures at the time of sintering the ceramics and are present as a glassy phase in the grain boundary after cooling to room temperature.

The glassy phase present in the grain boundary in the substrate material is volatilized in the high temperature plasma atmosphere at the time of diamond coating to give rise to peeling off of the film of diamond-and-the-like. Therefore, it becomes necessary that the film of diamond-and-the-like as a protective film be first applied at a temperature which does not volatilize the glassy phase at the grain boundary.

According to the present invention, there is provided a method for coating a substrate formed of a silicon nitride based material with a film of diamond-and-the-like by a gas phase synthesis technique comprising a first step of applying said film of diamond-and-the-like at a temperature not higher than a temperature at which the grain boundary components of said substrate volatilize to a thickness which is sufficient to suppress volatilization of elements constituting grain boundary phase during a subsequent step, and a second step of synthesizing said film of diamond-and-the-like at a temperature which expedites synthesis of said film of diamond-and-the-like to give further a thickness, preferably, sufficient to give desired characteristics such as wear resistance to a resulting product.

With the silicon nitride based member coated with the film of diamond-and-the-like, produced in accordance with the present invention, diamond synthesis is performed in the first step at a temperature which does not volatilize the glassy phase in the grain boundary in the first step so that peeling off of the film of diamond-and-the-like is not incurred under a situation in which the glassy phase yielded at the time of sintering of ceramics formed of silicon nitride is volatilized in a high-temperature plasma atmosphere during diamond film synthesis. The film of diamond-and-the-like is effective in protecting the glassy phase in the grain boundary of the substrate.

In this manner, by diamond synthesis in the second step for providing wear resistance and corrosion resistance, the silicon nitride based member coated with a film of diamond-and-the-like may be produced in which the glassy phase in the grain boundary phase of the substrate is not degraded and in which the film of diamond-and-the-like is hardly peeled off from the substrate. The resultant product is thus excellent in durability, operational perfomance, particularly as a cutting tool, and economic effects due to simplified and yet expedite manufacturing.

DESCRIPTION OF PREFERRED EMBODIMENTS

The synthesis temperature in the first step is not higher than the volatilization temperature of the glassy phase in the grain boundary, depending on the sintering aid components in the silicon nitride based sintered body or on the method of diamond synthesis, and is preferably 700° to 900° C., e.g., in the case where diamond is synthesized on the Mg-containing silicon nitride based sintered body by a microwave plasma CVD method. In this case, if the temperature is lower than 700° C., the rate of diamond synthesis becomes significantly low with accompanying economic demerits. If the temperature is higher than 900° C., the glassy phase begins to be volatilized, as hereinbefore described.

The diamond film thickness in the first step is preferably 0.5 to 2 µm. If the thickness is less than 0.5 µm, the effect in preventing volatilization of the glassy phase in the grain boundary of the substrate material in the second step becomes poor, whereas, even if the thickness is larger than 2 µm, the effect in preventing volatilization is not improved further.

As for the reaction time or reaction temperature in the first step, it suffices if they satisfy the above-mentioned conditions for the diamond film thickness, depending on the components of the base material or the reaction gases.

After the thin film of diamond-and-the-like for preventing volatilization of the glassy phase in the grain boundary in the substrate material has been applied in the first step, another film of diamond-and-the-like is applied to a sufficient thickness (e.g., 5 to 100 µm) in the second step.

The synthesis temperature in the second step is preferably 950° to 1200° C., more preferably about 1000° to 1100° C., so long as other conditions are substantially the same. If the temperature is lower than 950° C., the diamond synthesis rate is lowered with accompanying economic demerits. If the temperature exceeds 1200° C., the graphite structure becomes more stable than the diamond such that the diamond synthesis rate is lowered.

It should be noted, however, that the film growth rate depends not only on the temperature, but other factors such as the pressure of the atmosphere, particularly, partial pressure of the carbon source gas. Optimum conditions for the second step may be selected from various known conditions for synthesizing the diamond-and-the-like films. The temperature control of the substrate can be made without changing the atmosphere, and thus it is very advantageous in the commercial production.

The diamond film thickness in the second step is preferably 5 to 100 µm. If it is thinner than 5 µm, the effect in improving wear resistance by diamond coating of the substrate becomes insignificant. Even if the thickness exceeds 100 µm, the effect would be not sufficiently improved further with accompanying economic demerits.

As for the reaction time or reaction pressure or the like conditions in the second step, generally it suffices if they satisfy the above-mentioned conditions for expedited formation of the diamond film thickness.

Typically, the silicon nitride based member coated with the film of diamond-and-the-like material according to the present invention may be produced by coating the substrate formed of a silicon nitride based material with a film of diamond-and-the-like to a thickness of 0.5 to 2.0 µm in the first step so that the grain boundary components of the substrate are not volatilized and by synthesizing a film of diamond-and-the-like in the second step to a thickness of 5 to 100 µm.

As to the substrate material, the silicon nitride based material includes sintered body of silicon nitride and/or Sialon as a major phase with a grain boundary phase usually in a glassy state but includes those with partly or substantially crystallized boundary phase. It should be noted that the present invention permits the presence of glassy boundary phase.

Typically, the silicon nitride based material includes a sintered ceramic body comprising $Si_3N_4$ crystal grains as a major phase, or a Sialon (preferably of β-type) generally expressed by $Si_{6-z}Al_zN_{5-z}O_2$ (where z is 0 to 4.2). The Sialon is a ceramic having a major phase of a solid solution formed of $Si_3N_4$ with Al and Oxygen. The major phase is usually at least 50 wt %, preferably 60 to 90 wt %, or more.

The silicon nitride based materials are produced using sintering aids which generally form the boundary phase. The sintering aids include compounds of Al, Si, Y, Zr, Mg, rare earth elements and the like, such compounds include oxides, nitrides, carbides, borides, or complex compounds of Al, Si, Y, Zr, Mg, rare earth elements and the like elements. Preferred are oxides of those elements usually in combination of two or more compounds.

The process for producing the silicon nitride based materials can be achieved by known methods, namely, starting materials are mixed, formed (or molded) and sintered at, e.g., 1500°–2000° C., preferably 1600°–1800° C. The substrate is usually ground and/or polished before the film formation, usually to a surface smoothness equivalent to a tip of commercial grade.

To produce the film of the diamond-and-the-like, the gas phase synthesis technique is employed. Generally, it comprises so called vapor deposition technique such as physical vapor deposition, chemical vapor deposition etc. Preferred are ones in which carbon is supplied from a carbon source and energized into a plasma gas to be deposited on a substrate. Presence of hydrogen is preferred to inhibit deposition of amorphous carbon or graphite. The carbon source includes hydrocarbon or carbon monoxide or like carbon sources.

For energizing gas materials, generally plasma CVD technology is preferred, e.g., microwave plasma, RF plasma, DC plasma, magnetic plasma, thermal plasma etc. Most preferred is the microwave plasma CVD (ones under magnetic field, too).

The temperature for the first step and the second step is specifically selected according to the invention. The atmosphere conditions of the film synthesis may be selected from the known range, usually under the evacuated pressure. Several tens to about 100 Torr would give a satisfactory result.

The diamond-and-the-like includes not only pure diamonds, usually in a polycrystalline state, but allows the presence of a minor amount of analogous phase which may be termed generally as "diamond-like carbon film", too. The presence of diamond major phase can be determined through Raman scattering spectrum by a peak which is characteristic for the diamond at about $1333^{cm-1}$.

The film growth rate of diamond is dependent on the temperature around 900°–1000° C. which is known in the art, e.g., FIG. 4 (p. 108) T. Ito et al, Science and Technology of New Diamond, pp 107–109, KTK Scientific Publishers. An expedited film growth rate is achieved usually at 950° C. or above under the condition of CO and $H_2$ atmosphere in the microwave plasma CVD method.

For further details of the various conditions of the diamond film synthesis reference is made to the above article of T. Ito et al.

The film growth rate in the second step should be substantially greater than the first step, for the economical aspect e.g., at least by a factor of 1.3, preferably by 1.5, more preferably by about 1.8 or more, most preferably 1.9 or more. In the first step, the film growth rate should be moderate so as to provide a firm adhesion to the substrate and sufficient and uniform coverage over the entire surface including the grain boundary phase without deteriorating the grain boundary phase. In this regard, it should be noted that there is no specific limitation in the film growth rate so long as the requirements for the first step are satisfied.

EXAMPLES

Example 1

5 wt % each of zirconium oxide ($ZrO_2$) and magnesium oxide (MgO), as sintering aids, having specific surface area of 5 m²/g and about 10 m²/g, respectively, the balance being silicon nitride ($Si_3N_4$) of average particle size 0.7 μm (10 m²/g), were mixed together in a ball mill for 16 hours, and subsequently sintered in a pressurized nitrogen gas atmosphere under a pressure of 80 atm at 1800° C. for 2 hours. Surface areas were measured by the Brunaver-Emmett-Teller method ("BET") which is widely used for surface area determinations by computing the monolayer area. See generally McGraw Hill, Encyclopedia of Science and Technology, 1971, Vol. I, p. 98, Vol. 9, p. 669. The resulting sintered body was processed by grinding with a diamond grinding wheel to produce silicon nitride ceramics equivalent to a cutting tip SPGN 421 having a surface roughness of 14μ" RMS (Rmax 1.0 μm).

This tip was set as a substrate in a reaction vessel of a microwave plasma CVD apparatus. The reaction was carried out for one hour under conditions of a substrate temperature of 900° C. and a pressure within the reaction chamber of 50 Torr, with a feed gas flow rate into the reaction chamber being set to 20 SCCM for carbon monoxide gas and to 80 SCCM for hydrogen gas, respectively, and with a microwave output set to 300 W, for forming the diamond on the substrate to a thickness of 1 μm (, i.e., at a film growth rate of 1 μm/hour) (first step).

Subsequently, the substrate temperature in the microwave plasma CVD apparatus was further raised to 1,000° C., and the reaction was carried out for ten hours under otherwise the same conditions as described above for coating the substrate with a diamond film to an additional thickness of 19 μm (, i.e., at a film growth rate of 1.9 μm/hour), that is to a total thickness of 20 μm, to produce a sample of Example 1. (Second step)

In this Example, a temperature difference of 100° C. between the first step and the second step provided sufficient difference in the film growth rate.

As a result of a Raman spectroscopic analysis of the coating film of Example 1, it was found that a peak ascribable to diamond was present in the vicinity of 1,333 $cm^{-1}$ of the Raman scattering spectrum so that the diamond in the film was substantially free from impurities.

Using the sample of Example 1, a cutting test was carried out under the following conditions:

| Work: | aluminum alloy (containing 8 wt % of silicon) |
|---|---|
| Cutting speed: | 800 m/min |
| Feed Rate: | 0.1 mm/rev |
| Depth of cut: | 0.25 mm |
| Coolant: | Dry |

It was found that, after the cutting test for 30,000 m, there occurred no peeling off of the diamond film or abnormalities such as chipping.

Comparative Example 1

Using a substrate employed in Example 1, as a tip, the reaction was carried out in a microwave plasma CVD apparatus under conditions of a substrate temperature of 1,000° C. and a pressure within the reaction chamber of 50 Torr, with the feed gas flow rates being set to 20 SCCM and 80 SCCM for the carbon monoxide gas and for the hydrogen gas, respectively, and with the microwave output being set to 300 W, for coating the substrate with a diamond film of 20 μm for producing a sample of Comparative Example 1. Meanwhile, the method of Comparative Example 1 corresponds solely to the second step of Example 1.

Using the sample of Comparative Example 1, a cutting test was carried out out under the same conditions as those for Example 1.

As a result of the test, peeling off was seen to have occurred between the diamond film and the substrate after cutting 10,000 m. After the cutting test, the substrate side surface of the diamond film peeled off was checked with a scanning electron microscope (SEM). It was found that substrate components were affixed to the diamond film surface thus indicating that film peeling off was incurred as a result of deterioration in strength of the corresponding substrate surface portion.

It is seen from above that the present invention provides a method for producing the silicon nitride based member coated with a film of diamond-and-the-like according to which the glassy phase in the grain boundary of the silicon nitride based material is protected by the first step to improve a tight adhesion characteristic of the film of the diamond-and-the-like without accompanying volatilization of the glassy phase at the time of synthesis of the film of diamond-and-the-like in the second steps. The result is that a silicon nitride based member coated with the film of diamond-and-the-like may be produced which is excellent in durability, operational performance and economic effects.

Example 2

Another silicon nitride based substrate material is prepared using 71 wt % $Si_3N_4$ power of 0.7 μm average particle size, 11 wt % $Y_2O_3$ powder of 2 μm average particle size, 3 wt % $Al_2O_3$ powder of 1 μm average particle size, and 15 wt % TiN powder of 1 μm average particle size, wet mixing in a ball mill, drying and compacting followed by sintering under normal pressure in a nitrogen atmosphere at 1700° C. for one hour. Without subjecting to crystallization treatment of boundary phase, the resulting sintered body is further ground to a tip of a cutting tool shape SPGN 421 to a similar surface smoothness as Example 1, and then subjected to a first step of diamond synthesis at 950° C. otherwise under the same condition as in Example 1.

The resultant mass is further processed according to the method of the second step substantially equivalent to Example 1 resulting in a diamond-coated sample tip. This tip has substantially equivalent cutting performance to Example 1 when tested under the same condition as Example 1.

It should be noted that modification may be made without departing from the gist and scope of the present invention as herein disclosed and claimed in the appendent claims. Particularly the following general information can be considered in practicing the present invention.

According to the foregoing embodiments, a silicon nitride having substantially glassy grain boundary phase was used as a substrate. However, it is noted that the present invention is not limited to such silicon nitride and can be applied to silicon nitride base substrate materials with various structures of the grain boundary phase, irrespective of the type and composition of the grain boundary phase.

As for the diamond synthesizing method, there are various known methods, generally classified in chemical transport reaction method, thermal energization method, halogen promotion method and plasma energization method. Under the plasma energization method, microwave plasma method, high frequency plasma method and direct current plasma method are counted. In the plasma method, the substrate is heated through heat conduction from the plasma itself and induction heating. The film growth rate also depends on the gas pressure, generally amounting to 1 μm/hour at a pressure of 100 Torr or less counted for one of the preferred methods, due to the stability for long operation, excellent reproducibility, low contamination of impurities from electrode materials because of its electrodeless discharge in order to achieve a diamond film of high quality. For controlling the plasma, magnetic field can be applied. For expedited film growth, a higher pressure of 200 Torr or above may be used for stabilizing the plasma, under which argon (inert gas) may be mixed with carbon source (CO or hydrocarbon etc).

As for the temperature dependency of diamond growth rate, reference is made to M. Kamo et al, Proc. 2nd Int. Symp. Diamond Mater. The Electrochemical Soc. (1991) p. 20 under methane/hydrogen system; as well as E. Kondoh et al, Phys. Lett. 59 (1991) 488 under the thermal filament method.

The pressure under which the diamond-and-the-like is deposited generally ranges $10^{-6}$ to $10^3$ Torr, practically $10^{-5}$ to 800 Torr. Preferably, the second step is carried out at a temperature of at least 50° C. (more preferably 100° C.) higher than that in the first step.

We claim:

1. A method for coating a substrate of a cutting tool formed of a silicon nitride based material with a diamond film by a gas phase synthesis technique comprising
   providing a substrate of a sintered silicon nitride based material having grain boundary components which volatilize at a lower temperature than silicon nitride;
   a first step of applying said diamond film at a temperature less than a temperature at which the grain boundary components of said substrate volatilize, to a thickness which is sufficient to suppress volatilization of elements constituting a grain boundary phase during a subsequent step, and
   a second step of synthesizing said diamond film at a temperature which expedites synthesis of said diamond film to increase the thickness.

2. The method as defined in claim 1 in which the first step is carried out until a thickness of 0.5 to 2.0 μm.

3. The method as defined in claim 1 or 2 in which the second step is carried out until a thickness of at least 5 μm.

4. The method as defined in claim 2, in which the second step is carried until a thickness of 5 to 100 μm.

5. The method as defined in claim 1 or 2, in which the first step is carried out at a temperature of 700°–900° C.

6. The method as defined in claim 1 or 4, in which the first step is carried out at a temperature of 700°–900° C. in the case where the bounary phase comprises elements Mg and/or Zr.

7. The method as defined in claim 1 or 4, in which said boundary phase comprises a glassy phase.

8. The method as defined in claim 1 or 4, in which the second step is carried out at a temperature of 950°–1200° C.

9. The method as defined in claim 3, in which the second step is carried out at a temperature of 950°–1200° C.

10. The method as defined in claim 1 or 4, in which the substrate is maintained at a temperature of 700°–900° C. during the first step.

11. The method as defined in claim 8, in which the substrate is maintained at a temperature of 950°–1200° C. during the second step.

12. The method as defined in claim 1 or 2, in which the first step is carried out at 900° C. to form a diamond film to a thickness of at least 1 μm, and the second step is carried out at 1000° C. to form a further diamond film to a thickness of at least 5 μm.

13. The method as defined in claim 12, in which the second step is carried out to form a thickness of at least 19 μm.

14. The method as defined in claim 1, 2 or 4, in which the first and second steps are carried out by a microwave plasma CVD method in an evacuated atmosphere.

15. The method as defined in claim 14, in which said atmosphere comprises carbon monoxide gas and hydrogen gas.

16. The method as defined in claim 1 or 4, in which said film is synthesized in the second step at a temperature of at least 50° C. higher than that in the first step.

17. The method as defined in claim 1 or 4, in which said film is synthesized in the second step at a temperature of at least 100° C. higher than that in the first step.

18. The method as defined in claim 1 or 4, in which said film is synthesized at a higher film growth rate by a factor of at least 1.3 than the first step.

19. The method as defined in claim 1 or 4, in which said film is synthesized in the second step at a higher film growth rate by a factor of at least 1.5 than the first step.

20. The method as defined in claim 1 or 4, in which said film is synthesized in the second step at a higher film growth rate by a factor of at least 1.8 than the first step.

21. The method as defined in claim 1 or 4, in which said second step is carried out at a temperature of 1000°–1100° C.

22. The method as defined in claim 1 or 4, wherein said film is synthesized in the second step at a higher film growth rate by a factor of at least 1.9 than the first step.

23. The method as defined in claim 1, wherein the substrate has a surface smoothness of 14µ" RMS (Rmax 1.0 µm).

* * * * *